(12) United States Patent
Chen et al.

(10) Patent No.: US 6,512,280 B2
(45) Date of Patent: Jan. 28, 2003

(54) INTEGRATED CMOS STRUCTURE FOR GATE-CONTROLLED BURIED PHOTODIODE

(75) Inventors: Zhiliang J. Chen, Plano, TX (US); Kuok Y. Ling, Plano, TX (US); Hisashi Shichijo, Plano, TX (US); Katsuo Komatsuzaki, Niihari-mura (JP); Chin-Yu Tsai, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/859,121

(22) Filed: May 16, 2001

(65) Prior Publication Data

US 2002/0171097 A1 Nov. 21, 2002

(51) Int. Cl.⁷ .................. H01L 31/072; H01L 31/06
(52) U.S. Cl. .................. 257/465; 257/292; 257/462
(58) Field of Search ................ 257/292, 462, 257/465

(56) References Cited

U.S. PATENT DOCUMENTS

| | | | | |
|---|---|---|---|---|
| 5,563,429 A | * | 10/1996 | Isogai | 257/258 |
| 5,698,874 A | * | 12/1997 | Hayashi | 257/232 |
| 5,898,196 A | * | 4/1999 | Hook et al. | 257/291 |
| 6,026,964 A | * | 2/2000 | Hook et al. | 257/236 |
| 6,392,263 B1 | * | 5/2002 | Chen et al. | 257/232 |

\* cited by examiner

*Primary Examiner*—Allan R. Wilson
(74) *Attorney, Agent, or Firm*—Frederick J. Telecky, Jr.; W. James Brady, III

(57) ABSTRACT

A light-sensing diode fabricated in a semiconductor substrate having a surface protected by an insulator, comprising a first region of one conductivity type in this substrate, a second region of the opposite conductivity type forming a junction with the first region in the substrate; this junction having a convoluted shape, providing two portions generally parallel to the surface, and a constricted intersection with the surface; and a gate for applying electrical bias across the junction, this gate positioned on the insulator such that it covers all portions of the junction intersection with the surface, thereby creating a gate-controlled photodiode.

9 Claims, 2 Drawing Sheets

INTEGRATED CMOS STRUCTURE FOR GATE-CONTROLLED BURIED PHOTODIODE

FIELD OF THE INVENTION

The present invention is related in general to the field of electronic systems and semiconductor devices, and more specifically to photodiodes and pixels fabricated by the CMOS technology, yet having reduced dark current, improved light sensitivity and responsivity, and high level of integration.

DESCRIPTION OF THE RELATED ART

Digital imaging devices are becoming increasingly popular in a variety of applications such as digital cameras, fingerprint recognition, and digital scanners and copiers. Typical prior art digital imaging devices are based on Charge Coupled Device (CCD) technology. CCD devices have an array of CCD cells, each cell comprising a pixel. Each CCD pixel outputs a voltage signal proportionate to the intensity of light impinging upon the cell. This analog voltage signal can be converted to a digital signal for further processing, digital filtering, and storage. As is well known in the art, a two-dimensional digital image can be constructed from the voltage signal outputs created by a two-dimensional array of CCD cells, commonly referred to as a sensor array.

CCD arrays have the shortcoming that the CCD fabrication requires a special process flow, which is not compatible with the standard CMOS process flow dominating today's manufacturing technology due to its flexibility and low cost. Consequently, the CCD array cannot be easily integrated with other logic circuits, such as CCD control logic and analog-to-digital converters. Additionally, in operation, a CCD array requires multiple high voltage supplies from 5 V to 12 V, and tends to consume a large amount of power.

CMOS technology has recently been considered for imager application. CMOS area (or 2-dimensional) sensor arrays can be fabricated in standard CMOS process and thus other system functions, such as controller, analog-to-digital, signal processor, and digital signal processor, can be integrated on the same chip. CMOS area array sensors (or CMOS imagers) can operate with a single low supply voltage such as 3.3 V or 5.0 V. The cost of CMOS processing is also lower than that of CCD processing. The power consumption of a CMOS sensor is lower than that of a CCD sensor.

In order to fabricate photodiodes and pixels in CMOS technology, however, a number of problems have to be overcome, foremost the unacceptably high level of reverse bias leakage or "dark" current of the photodiodes. Another challenge is the best possible level of integration, the so-called "fill factor". The reverse bias or dark current is dominated by generation current in the junction depletion region. This current is proportional to the depletion width and the intrinsic carrier concentration, and inverse proportional to the recombination lifetime. Methods to reduce the dark current include lowering the temperature, or operating at lower supply voltage, or reducing the recombination/generation centers in the depletion region. The latter option is the most promising.

The recombination/generation centers originate mainly from
- lattice defects introduced during processing, especially
  - implant damage not annealed by subsequent thermal treatment;
  - damage induced by reactive ion etching (such as gate poly-silicon and shallow trench isolation etching);
  - stress-induced defects, for instance at STI edges;
- surface states, prominently
  - electron traps at the Si-SiO2 interface;
  - depletion region extending to and including the silicon surface directly under the oxide;
- impurities, for example
  - dopants and
  - metal contamination primarily from silicide.

In known technology, a number of approaches have been described to minimize at least several of these origins and thus reduce the dark current. In U.S. Pat. No. 5,625,210, issued Apr. 29, 1997 (Lee et al., "Active Pixel Sensor Integrated with a Pinned Photodiode"), extends the concept of a pinned photodiode, known in CCD technology, by integrating it into the image sensing element of an active pixel sensor, fabricated in CMOS technology. An additional first implant creates a photodiode by implanting a deeper n+ dopant than used by the source and drain implants, increasing the photo-response. An additional pinning layer implant, using high doses of a low energy p+ dopant, is then created near the surface; this pinning layer is not in electrical contact with the p-epitaxial layer over the p-substrate. This approach has many additional process steps and is too expensive for mass production.

Other approaches to reduce the dark current have been described at technical conferences such as ISSCC 1999, ISSCC 2000, and IEDM 2000. These approaches include optimizing the shallow trench liner oxidation in order to minimize defects at the active edge, blocking silicide, annealing with hydrogen in order to passivate defects, varying anneal cycles and well junction depths. Non of these efforts were completely satisfactory, especially with respect to minimum number of process steps and low cost manufacturing.

The challenge of cost reduction implies a drive for minimizing the number of process steps, especially a minimum number of photomask steps, and the application of standardized process conditions wherever possible. These constraints should be kept in mind when additional process steps or new process conditions are proposed to reduce photodiode dark current and improve light sensitivity and responsivity without sacrificing any desirable device characteristics. An urgent need has, therefore, arisen for a coherent, low-cost method of reducing dark current in photodiodes fabricated by CMOS technology, and, simultaneously, improve the degree of component integration at the pixel level. The device structure should further provide excellent light responsivity and sensitivity in the red as well as the blue spectrum, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A light-sensing diode fabricated in a semiconductor substrate having a surface protected by an insulator, comprising a first region of one conductivity type in this substrate, a second region of the opposite conductivity type forming a junction with the first region in the substrate; this junction having a convoluted shape, providing two portions generally parallel to the surface, and a constricted intersection with the surface; and a gate for applying electrical bias across the junction, this gate positioned on the insulator such that it covers all portions of the junction intersection with the surface, thereby creating a gate-controlled photodiode.

This gate, referred to as the transfer gate, represents the gate of an additional ("fourth") MOS transistor. Its drain is merged with the source of the reset transistor, which, in turn, is electrically coupled to the gate of the sensing transistor. The drain of the reset transistor is merged with the source of the sensing transistor. During the reset period of the photodiode, the third transistor and the reset transistor are turned on. During the sensing period, the third transistor is on and the reset transistor is off. Consequently, the sensing transistor senses the photodiode voltage through the n-channel under the transfer gate.

The invention applies to semiconductors both of p-type and n-type as "first" conductivity types; preferably, the semiconductors are in the 1 to 50 Ωcom resistivity range. The semiconductor may consist of an epitaxial layer deposited on higher conductivity substrate material.

It is an aspect of the invention that the image-capturing device is fabricated with standard CMOS technology and the dark (leakage) current reduced by producing a buried junction, away from the surface, without an extra process step by utilizing the p-well implant. The invention thus reduces leakage current created by the junction perimeter intercepting the surface by reducing the effect of surface-related traps, dangling bonds, recombination/generation centers, and other surface effects creating leakage.

Another aspect of the invention is that the method is fully compatible with deep sub-micron CMOS technology, such as 0.18 μm and smaller.

The application of a surface-near extension of the p-well into the n-well, as a "compensating" p-well, reduces greatly the photodiode leakage current, since it eliminates surface-related recombination/generation centers from the junction depletion region.

It is an essential aspect of the present invention that the shallow compensating p-well in the n-well can be created without an additional ion implant step by using the general p-well implant. The design of the location and periphery of the remaining n-well is flexible.

Another aspect of the invention is that the compensating p-well increases the total junction depletion region of the photodiode. Consequently, more carriers are generated in the photodiode per incident light, resulting in a more sensitive photodiode.

Another aspect of the invention is that the newly created compensating p-well/n-well junction is near and about parallel to the surface. Consequently, an increased responsivity to the short wavelength spectrum is created.

It is a technical advantage of the present invention that the dopant concentrations and the junction depths of the compensating p-well, the n-well, and/or the p-well and p-substrate can be manufactured according to pre-determined device and process modeling, and are thus very flexible.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 09/848,637, filed on May 3, 2001 (Chen et al., "CMOS Photodiode having Reduced Dark Current and Improved Light Sensitivity and Responsivity"), which is herewith incorporated by reference.

Figure 1B:
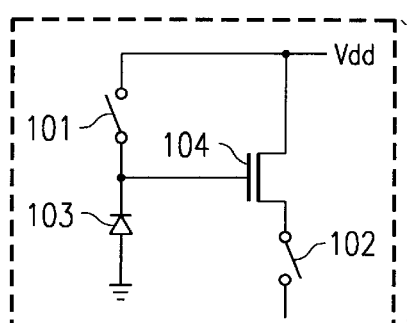
FIG. 1B shows the schematic of an individual pixel of the array in FIG. 1A, highlighting the location of the light-sensing diode.
Figure 1A:
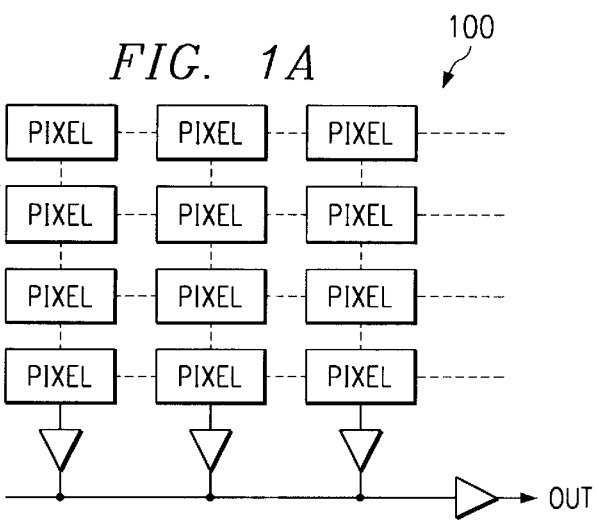
FIG. 1A depicts schematically a 2-dimensional CMOS sensor array.

FIG. 1A is a schematic example of a 2-dimensional CMOS sensor array and pixel scheme, generally designated 100. FIG. 1B, an insert to FIG. 1A, illustrates a layout of an individual pixel. The pixel reset switch is designated as 101 and the pixel select switch as 102. During reset operation, the reset switch 101 is closed and the photodiode 103 is then biased up to Vdd. During the light sensing period, the reset switch 101 is open. The photodiode voltage Vdd will be decreased, due to the photodiode charge being discharged by carriers generated from an incident light. The change of photodiode voltage is thus measured by a sensing NMOS transistor 104 by closing the reset switch 101.

Figure 1C:
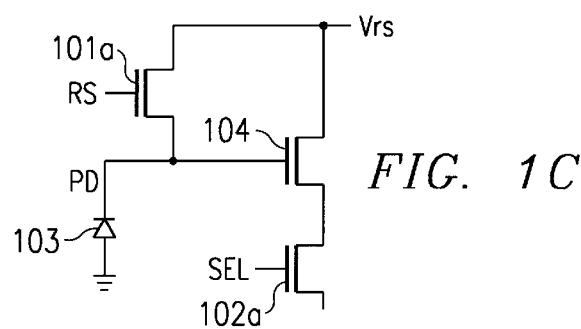
FIG. 1C repeats the schematic of the pixel in FIG. 1B, emphasizing the MOS transistors.

The CMOS pixel schematic of FIG. 1C redraws FIG. 1B in order to show the MOS transistors included in the pixel. The photodiode 103 is coupled to the reset transistor 101a and the sensing transistor 104; the selection transistor 102a is coupled to the sensing transistor 104. Vdd is renamed reset voltage Vrs.

Figure 2:
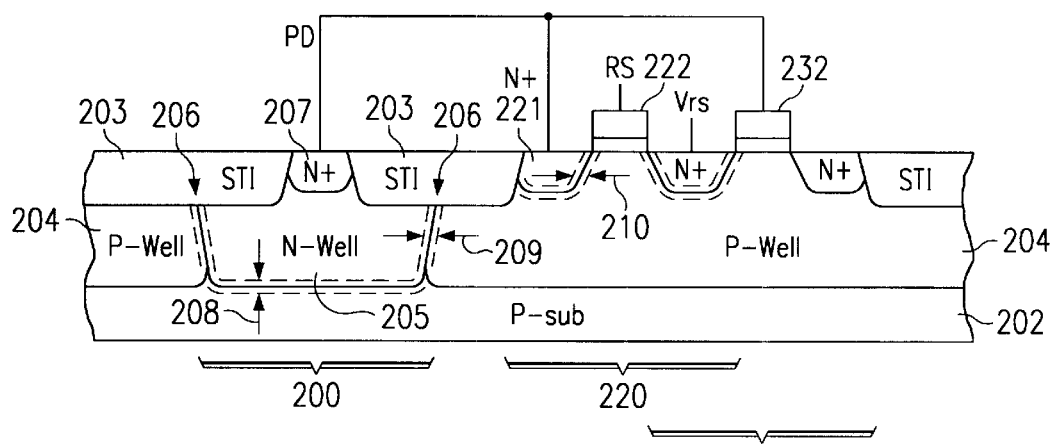
FIG. 2 is a simplified and schematic cross section of the pixel shown in FIGS. 1B and 1C, for known CMOS technology.

The impact of the present invention can be most easily appreciated by highlighting the shortcomings of the known technology. FIG. 2 illustrates a typical CMOS pixel in deep sub-micron CMOS technology, consisting of the photodiode 103 and three transistors (transistor number three, the selection transistor, is not shown in FIG. 2) The photodiode, generally designated 200, uses p-type silicon substrate 202. An insulating layer 203 of shallow trench isolation (STI) protects one surface of substrate 202. Into substrate 202 has been fabricated a p-well 204, which surrounds an n-well 205. The junctions between p-well 204 and n-well 205 are formed by the n-well/p-substrate portion (indicated by its space charge or depletion region 208 under reverse bias) and the n-well/p-well peripheral portions (again indicated by their depletion regions 209). Junction portions 209 intersect the surface, protected by the insulator 203, along line 206. A heavily n-doped region 207 enables electrical contact to n-well 205.

The reset transistor 220, operable as the reset switch, connects the photodiode 200 to the reset voltage supply Vrs. The contributions to the photodiode leakage current come from several sources:

n-well/p-substrate junction 208 leakage;
n-well/p-well junctions 209 leakage;
n+/p-well junctions 210 leakage; and
reset transistor 220 off current when RS voltage Vrs is low.

In deep sub-micron CMOS technology with its ongoing trend towards miniaturization, the leakage current from the n+/p-well junctions is dominant. Consequently, the overall pixel dark current is high. Its magnitude limits the pixel performance and CMOS imager performance. Another disadvantage is that the minimum space requirement of the n+ diffusion to the n-well results in a large pixel size and, therefore, low density or "fill factor".

In FIG. 2, the sensing transistor is designated 230. It is partially merged with reset transistor 220; its gate 232 is electrically connected to the diode cathode 207 and the source 221 of the reset transistor. The selection transistor is not shown in FIG. 2. The gate 222 of the reset transistor is connected to the reset voltage supply.

Figure 3:
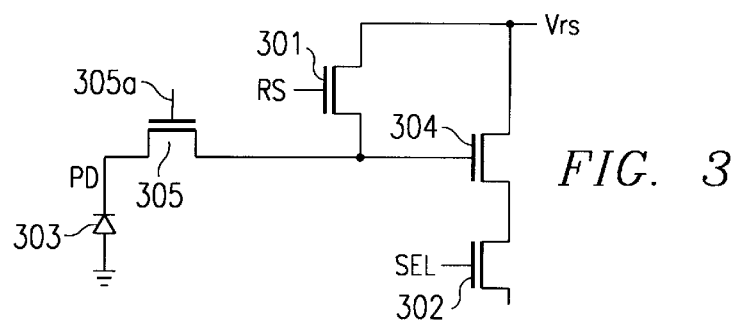
FIG. 3 shows the schematic of an individual pixel of the array in FIG. 1A according to the present invention.

The photodiode dark current is greatly reduced, and the pixel density ("fill factor") improved, by the embodiments of the present invention. FIG. 3 illustrates a layout of an individual pixel according to the invention. The photodiode 303 is coupled to the reset transistor 301, the sensing transistor 304 and the selection transistor 302 through a MOS transistor 305 (referred to here as the "fourth" transistor) such that the drain of the additional transistor 305 is merged with the source of the reset transistor 301. The gate 305a of the additional transistor controls the junction of the photodiode.

Figure 4:
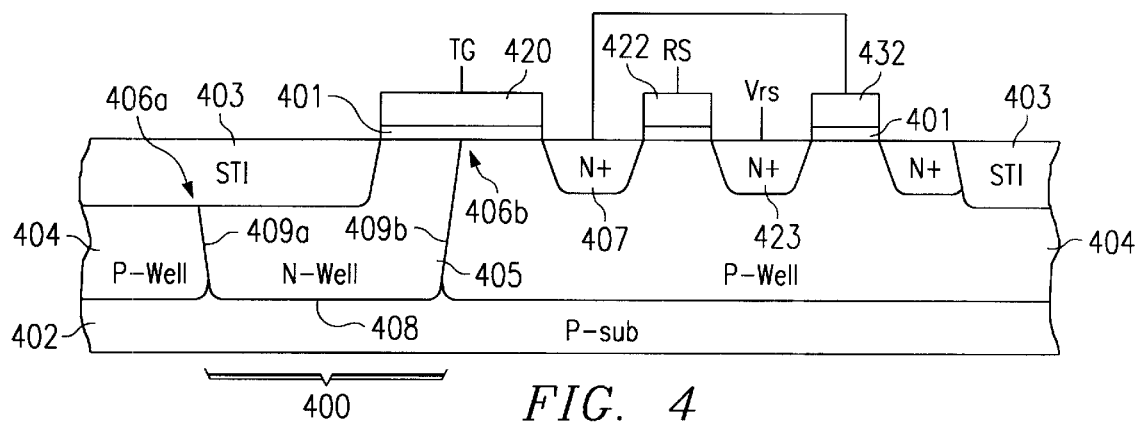
FIG. 4 is a simplified and schematic cross section of the first embodiment of a pixel according to the present invention.

FIG. 4 is simplified cross section of the pixel shown as a schematic in FIG. 3, illustrating the first embodiment of the present invention. The photodiode, generally designated 400, uses p-type silicon substrate 402. As defined herein, the term "substrate" refers to the starting semiconductor wafer. As shown in FIG. 4, in present manufacturing, the substrate typically has p-type doping. For clarity, this case is also selected as the basis for the following discussions. It should be stressed, however, that the invention and all description also cover the case where the substrate has n-type doping. In FIG. 4, the substrate is designated 402. Frequently, but not necessarily, an epitaxial layer of the same conductivity type as the substrate has been deposited over the substrate; in this case the term "substrate" refers to epitaxial layer plus starting semiconductor.

An insulating STI layer 403 protects one surface of substrate 402. Using STI technology in deep sub-micron CMOS process (such as 0.18 μm and smaller), gate insulators (usually oxides) 401 can be formed wherever needed.

Into substrate 402 has been fabricated a well 404 of the conductivity type of the substrate (a p-well). It surrounds a well of the opposite conductivity type, an n-well 405. The junctions between p-well 404 and n-well 405 are formed by the n-well/p-substrate portion 408 and the n-well/p-well peripheral portions 409a and 409b. It is important to notice that junction portion 409a intersects the surface, protected by the insulator 403, along line 406a, while junction portion 409b intersects the surface under gate oxide 401 along line 406b. Since there is no heavily n-doped region as an electrical contact to n-well 405, the well junctions are controlled by gate 420 ("transfer gate") of the additional pixel transistor.

Gate 420 is positioned on the gate oxide 401 such that it extends across regions of p-well 404 and n-well 405; consequently, gate 420 extends across junction 409b at line 406b, and thus provides control of photodiode 400. The reset of photodiode 400 is carried out by turning on both the additional transistor and the reset transistor. During the sensing period, the additional transistor is on and the reset transistor is off; the sensing transistor is thus sensing the photodiode voltage through the n-channel under the transfer gate.

The MOS reset transistor, operable as the reset switch RS, is integrated with the photodiode such that
the source of the reset transistor is merged with the n+drain 407 of the additional transistor; and
drain 423 of the reset transistor is connected to the reset voltage supply Vrs.

The MOS sensing transistor has source, drain and gate, and is integrated with the reset transistor such that
the source of the sensing transistor is combined with the reset drain 423; and
the gate 432 is electrically connected to reset source 407.

In the integrated pixel of FIG. 4, no n+/p-well junction is connected to the photodiode. Consequently, the first embodiment of the present invention depicted in FIG. 4 has a greatly reduced photodiode leakage current compared to the conventional CMOS structure depicted in FIG. 2. Furthermore, by eliminating the extra n+diffusion of the n-well contact, the density of integration represented by FIG. 4 is higher compared to the more area-consuming conventional design of FIG. 2.

Figure 5:
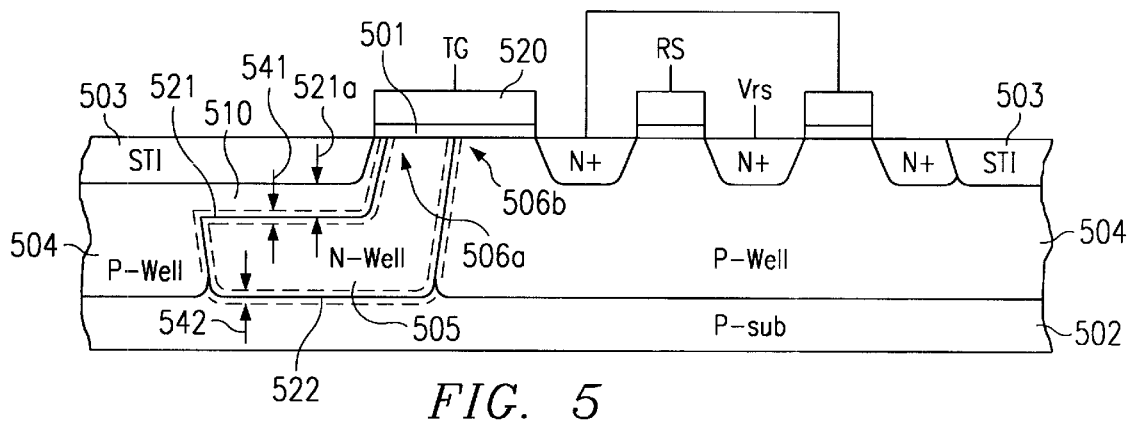
FIG. 5 is a simplified and schematic cross section of the second embodiment of a pixel according to the present invention.

FIG. 5 illustrates the second embodiment of the present invention. The well 504 of the first conductivity type (p-type) has at least one extension 510 (also p-type) along the surface under the insulator 503 into the well 505 of the opposite conductivity type (n-type). Extension 510 may be called a "compensating p-well", since it is p-doped to overcompensate the n-doping of well 505. This compensating p-well 510 forms a buried, near-the-surface junction 521 with well 505. Junction 521 is generally parallel to the semiconductor surface and insulator layer 503. Practical distances 521a of junction 521 from the surface with the STI layer have been manufactured in the 0.5 to 1.0 μm range.

With the geometry of compensating well 510, junctions extend in two different planes under the semiconductor surface, oriented generally parallel to the surface: Junction 521 of the compensating p-well 510 with n-well 505, and junction 522 of the n-well 505 with p-substrate 502. Together, the junctions have a convoluted shape.

Junction 521 of the compensating p-well 510 intersects the surface under the gate oxide 501 at line 506a, minimizing the surface junction as compared to the intersect 406a illustrated in FIG. 4. The intersect 506b with the gate oxide 501, also remains under gate 520. Consequently, the complete junction of the photodiode is gate-controlled, and further, since the compensating p-well eliminates the largest portion of the surface junction, it diminishes the total photodiode leakage/dark current.

When electrical reverse bias is applied to the photodiode, space charge/depletion regions are formed at the junctions. At junction 521, depletion region 541 is formed, at the junction 522, depletion region 542. As FIG. 5 demonstrates, the total junction depletion region of the photodiode is significantly increased, compared to the conventional diode in FIG. 2. Consequently, more carriers can be generated in the photodiode for a given incident light, resulting in a more sensitive photodiode.

On the other hand, since the depletion 541 does not include any silicon surface, the multiple recombination/generation centers related to the surface (listed above in the section on Related Art) are avoided, and the photodiode leakage current is greatly reduced.

In addition, due to the proximity of junction 521 to the semiconductor surface, the responsivity of the photodiode to the shorter wavelength spectrum is improved.

During the reset period, the voltage at the transfer gate 520 is high; an n-channel is formed in the p-well portion under the transfer gate 520, and the photodiode is reset to Vrs.

The fabrication of the compensating p-well in deep submicron CMOS technology does not necessarily require extra process steps. In some twin well CMOS processes, the p-well concentration is higher than the n-well concentration near the silicon surface, and the n-well concentration is higher than the p-well concentration deeper below the silicon surface. In such cases, the nwell is first formed, and an opening is then made in the pwell mask over the photodiode n-well. This opening of the n-well receives then the same p-well implants as the core p-well regions, resulting in the formation of the compensating p-wells.

The preferred method of fabrication starts with a high resistivity semiconductor substrate material of a first conductivity type and comprises the following steps:

forming protective isolation regions into the surface of selected portions of the semiconductor;

implanting, at 20 to 380 keV, ions of the first conductivity type into the semiconductor to form a well of the first conductivity type shaped as an annulus such that a selected central portion of the semiconductor remains unimplanted;

implanting, at 50 to 700 keV, ions of the opposite conductivity type into the central portion to form a well having side walls surrounded by the well of the first conductivity type;

implanting, at 20 to 160 keV and 1·10E12 to 5·10E13 cm-2 dose, ions of the first conductivity type into at least one selected portion of the well of the opposite conductivity type to form, under and near the surface, a region of compensated conductivity, thereby extending along the surface under the insulator the well of the first conductivity;

rapidly annealing the ion implants;

depositing over portions of the surface a layer of insulating material suitable as gate dielectric;

forming gates of poly-silicon or other conductive material deposited onto the insulating layer;

forming source and drain regions to complete the diode and transistors; and forming contact metallizations at the source and drain regions. The sequence of the ion implant steps can be executed in any order; they can be reversed from the order given above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. One example is the choice between p- or n-type dopants for the first conductivity type. Another example is the diodes used in logic and analog circuits as candidates for suppressing surface induced leakage currents. It is therefore intended that the appended claims encompass any such modifications or embodiments.

We claim:

1. A light-sensing diode fabricated in a semiconductor substrate, said substrate having a surface protected by an insulator, comprising:

a first region of one conductivity type in said substrate, a second region of the opposite conductivity type forming a junction with said first region in said substrate;

said junction having a convoluted shape, providing first and second portions generally parallel to said surface, and a constricted intersection with said surface; and a gate for applying electrical bias across said junction, said gate positioned on said insulator such that it covers all portions of said junction intersection with said surface, thereby creating a gate-controlled photodiode;

a first MOS transistor, operable as a reset switch, having source, drain and gate terminals;

a second MOS transistor, operable as the sensing transistor, merged with said first transistor such that the source of said second transistor is combined with said drain of said first transistor, and the gate of said second transistor is electrically connected with said source of said first transistor; and means for applying electrical bias across said diode junctions and to said transistor terminals.

2. The light-sensing diode according to claim 1 wherein said first junction portion is located from the surface to a depth between 0.5 and 1.0 $\mu$m.

3. The pixel according to claim 1 wherein said diode has no surface contact other than said gate.

4. The pixel according to claim 1 further comprising electrical connections of said drain of said first transistor to the reset voltage supply, and said gate of said first transistor to the reset control.

5. The pixel according to claim 1 further comprising a third MOS transistor, coupled to said second transistor and operable as a pixel select switch.

6. The pixel according to claim 1 wherein said first conductivity type is p-type.

7. The pixel according to claim 1 wherein said second well has a doping concentration at said deep junction suitable to provide, under electrical reverse bias, a wide space charge region, attributing high light sensitivity to said diode.

8. The pixel according to claim 1 wherein said constricted surface area minimizes dark current in electrical operation.

9. The pixel according to claim 1 wherein said diode and said transistors are fabricated in a process flow according to CMOS technology materials, dimensions and process steps.

* * * * *